United States Patent
Baxter

(10) Patent No.: US 9,058,081 B2
(45) Date of Patent: Jun. 16, 2015

(54) APPLICATION USING A SINGLE PHOTON AVALANCHE DIODE (SPAD)

(75) Inventor: David Patrick Baxter, Edinburgh (GB)

(73) Assignee: STMICROELECTRONICS (RESEARCH & DEVELOPMENT) LIMITED, Marlow Bucks (GB)

( * ) Notice: Subject to any disclaimer, the term of this patent is extended or adjusted under 35 U.S.C. 154(b) by 116 days.

(21) Appl. No.: 13/242,587

(22) Filed: Sep. 23, 2011

(65) Prior Publication Data

US 2012/0133955 A1    May 31, 2012

(30) Foreign Application Priority Data

Nov. 30, 2010  (GB) .................................. 1020277.8

(51) Int. Cl.
| | |
|---|---|
| G09G 5/00 | (2006.01) |
| G06F 3/042 | (2006.01) |
| G01T 1/24 | (2006.01) |
| H03K 17/96 | (2006.01) |

(52) U.S. Cl.
CPC ........... *G06F 3/042* (2013.01); *Y10T 29/49002* (2015.01); *G06F 2203/04101* (2013.01); *H03K 17/9636* (2013.01)

(58) Field of Classification Search
CPC .......... G06F 2203/04101; G06F 3/042; H03K 17/9636; Y10T 29/49002
USPC .................................. 345/156, 175; 250/370
See application file for complete search history.

(56) References Cited

U.S. PATENT DOCUMENTS

| | | | |
|---|---|---|---|
| 4,158,853 | A | 6/1979 | Sullivan et al. |
| 4,822,042 | A | 4/1989 | Landsman |
| 5,226,650 | A | 7/1993 | Suttner |
| 6,042,483 | A | 3/2000 | Katayama |
| 6,580,496 | B2 | 6/2003 | Bamji et al. |
| 6,587,186 | B2 | 7/2003 | Bamji et al. |
| 7,133,739 | B2 | 11/2006 | Williamson et al. |
| 7,262,402 | B2 | 8/2007 | Niclass et al. |
| 7,301,608 | B1 | 11/2007 | Mendenhall et al. |
| 7,547,872 | B2 | 6/2009 | Niclass et al. |
| 7,684,020 | B1 | 3/2010 | Marti et al. |
| 8,355,117 | B2 | 1/2013 | Niclass |

(Continued)

FOREIGN PATENT DOCUMENTS

| | | |
|---|---|---|
| CN | 202032994 U | 11/2011 |
| DE | 10063694 A1 | 7/2002 |

(Continued)

OTHER PUBLICATIONS

Aull et al., "Geiger-Mode Avalanche Photodiodes for Three-Dimensional Imaging," Lincoln Laboratory Journal, Nov. 2, 2002, pp. 335-350.

(Continued)

*Primary Examiner* — Temesgh Ghebretinsae
*Assistant Examiner* — Kwin Xie
(74) *Attorney, Agent, or Firm* — Allen, Dyer, Doppelt, Milbrath & Gilchrist, P.A.

(57) ABSTRACT

An electronic device may include a housing having a mousing surface, and a navigation device carried by the housing and comprising a proximity detector. The proximity detector may include a single photon avalanche diode (SPAD) configured to detect movement of an activator adjacent the mousing surface. For example, the proximity detector may detect movement along three axes.

30 Claims, 4 Drawing Sheets

(56) References Cited

U.S. PATENT DOCUMENTS

| | | |
|---|---|---|
| 2002/0007676 A1 | 1/2002 | Ward et al. |
| 2004/0032970 A1 | 2/2004 | Kiraly |
| 2004/0046741 A1 | 3/2004 | Low et al. |
| 2006/0008116 A1 | 1/2006 | Kiraly et al. |
| 2006/0086896 A1* | 4/2006 | Han ............................ 250/221 |
| 2006/0189398 A1 | 8/2006 | Zanzucchi et al. |
| 2006/0192086 A1* | 8/2006 | Niclass et al. ............. 250/214.1 |
| 2006/0202129 A1 | 9/2006 | Niclass et al. ........... 250/370.14 |
| 2007/0182949 A1* | 8/2007 | Niclass ............................ 356/3 |
| 2007/0197314 A1 | 8/2007 | York et al. |
| 2007/0228358 A1 | 10/2007 | Ofek |
| 2008/0156993 A1 | 7/2008 | Weinberg et al. |
| 2008/0297487 A1 | 12/2008 | Hotelling et al. |
| 2009/0029793 A1 | 1/2009 | Cage |
| 2009/0039068 A1 | 2/2009 | Boutwell |
| 2010/0053119 A1* | 3/2010 | Hayasaka et al. ............. 345/175 |
| 2010/0133636 A1 | 6/2010 | Richardson et al. |
| 2010/0156830 A1 | 6/2010 | Homma et al. |
| 2010/0295821 A1 | 11/2010 | Chang et al. |

FOREIGN PATENT DOCUMENTS

| | | | |
|---|---|---|---|
| DE | 10257955 A1 | 7/2004 | |
| EP | 1622093 A1 | 2/2006 | |
| EP | 1688746 A2 | 8/2006 | |
| EP | 2071433 A2 | 6/2009 | |
| EP | 2 107 445 | 10/2009 | ............. G06F 3/033 |
| EP | 2107445 A1 | 10/2009 | |
| EP | 2144303 A1 | 1/2010 | |
| EP | 2145656 A2 | 1/2010 | |
| EP | 2149755 A1 | 2/2010 | |
| ES | 2162733 A1 | 1/2002 | |
| GB | 2267584 A | 12/1993 | |
| GB | 2306825 A1 | 5/1997 | |
| GB | 2473449 | 3/2011 | ............. G06F 3/033 |
| GB | 2473449 A | 3/2011 | |
| GB | 2484077 A | 4/2012 | |
| GB | 2486164 A | 6/2012 | |
| JP | 11253319 A | 9/1999 | |
| WO | 03074137 A1 | 9/2003 | |
| WO | 2005094953 A2 | 10/2005 | |
| WO | 2008068607 | 6/2008 | |
| WO | 2009124601 | 10/2009 | |
| WO | 2010/081652 | 7/2010 | ............. G06F 3/042 |
| WO | 2010081652 A1 | 7/2010 | |

OTHER PUBLICATIONS

Albota et al, "Three-Dimensional Imaging Laser Radars with Geiger-Mode Avalanche Photodiode Arrays," Lincoln Laboratory Journal, Nov. 2, 2002, pp. 351-370.

Stark et al., "Object Detection System Using SPAD Proximity Detectors," Proc. of SPIE, vol. 8167, 2011, pp. 81672A-1 to 81672A-12.

* cited by examiner

US 9,058,081 B2

APPLICATION USING A SINGLE PHOTON AVALANCHE DIODE (SPAD)

FIELD OF THE INVENTION

The present disclosure relates to an application using a single photon avalanche diode (SPAD).

BACKGROUND OF THE INVENTION

A SPAD is based on a p-n junction device biased beyond its breakdown region. The high reverse bias voltage generates a large enough electric field such that a single charge carrier introduced into the depletion layer of the device can cause a self-sustaining avalanche via impact ionization. The avalanche is quenched, either actively or passively to allow the device to be "reset" to detect further photons. The initiating charge carrier can be photo-electrically generated by a single incident photon striking the high field region. It is this feature which gives rise to the name "Single Photon Avalanche Diode." This single photon detection mode of operation is often referred to as Geiger Mode.

U.S. Pat. No. 7,262,402 to Niclass et al. discloses an imaging device using an array of SPADs for capturing a depth and intensity map of a scene, when the scene is illuminated by an optical pulse. U.S. Patent Application No. 2007/0182949 to Niclass discloses an arrangement for measuring the distance to an object. The arrangement uses a modulated photonic wave to illuminate the object and an array of SPADs to detect the reflected wave. Various methods of analysis are disclosed to reduce the effects of interference in the reflected wave.

Navigation devices, such as scroll wheels and mice, are used in many applications, including phones, computers, and many other devices or systems. A typical mouse scroll wheel provides motion control in either one or two axes and can be used to move a cursor up and down a screen and/or tilted to left and right. Similarly, a mouse, such as a fingermouse, may be used in many environments. A fingermouse can also detect movement in two axes, thereby providing four degrees of freedom. The fingermouse also may be used to move a cursor up and down and left and right on a screen.

SUMMARY OF THE INVENTION

An objective of the present disclosure is to use a SPAD as a solid state photo-detector for ranging, proximity detection, accelerometer usage etc.

An objective of the present disclosure is to provide an approach to at least some of the problems associated with the prior art.

An objective of the present disclosure is to provide a navigation device having a greater number of degrees of freedom, thereby providing a greater level of control features and functions.

According to one aspect, a navigation device may include a proximity detector for detecting movement of an activator above the navigation device. Optionally, the proximity detector comprises an array of SPADs, and an illumination source. The illumination from the illumination source may be reflected by the activator to the array of SPADs, and the array of SPADs may be arranged in rows and columns.

Also, the array of SPADs may be connected to a multiplexer and a counter to enable measurement of the reflected illumination. The output from the proximity detector may be passed to control circuitry for a device to enable generation of cursor movement on the device. Additionally, movement may be measured in three axes (X, Y, Z), and the movement in at least one axis may be used for functions other than navigation.

The present disclosure may offer a number of advantages. In particular, the ability to navigate in three axes rather than the typical two axes may provide greater flexibility and enhanced control functionality. In addition, as the navigation device can operate in the three axes, at least one axes may be used for functions other than navigation, for example, fingerprint analysis, volume control, etc.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
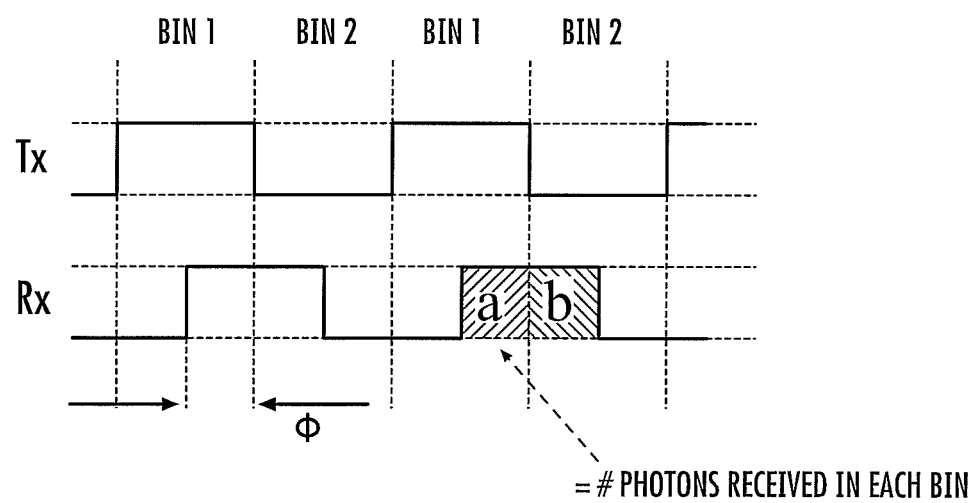
FIG. 1 is a diagram for illustrating the determination of phase shift in a SPAD, in accordance with an embodiment of the present disclosure.

The idea that a SPAD can be used as in a ranging application is borne out by the application of a Phase Shift Extraction Method for range determination, although alternative methods exist for range determination using SPADs based on direct time of flight (TOF) measurement. The term ranging in this application is intended to cover all ranging devices and methods including by not limited to ranging devices, proximity devices accelerometers etc. Ranging can occur in a number of applications, including proximity detection, which is relatively easy to implement and inexpensive. Laser ranging is more complex and costly than a proximity detector. Three-dimensional imaging is a high-end application that could be used to recognize gestures and facial expressions.

A proximity sensor is a ranging application. At its simplest, the sensor is capable of indicating the presence or absence of a user or object. Additional computation and illuminator complexity can provide enhanced data such as the range to an object. A typical range is of the order 0.01 m to 0.5 m. In a simple proximity sensor, the illumination source could be a modulated light emitting diode (LED), at a wavelength of about 850 nm.

The next application group is that of laser ranging, where the illumination source is a modulated diode laser. Performance can range from <1 cm to 20 m range (and higher for top end systems) with millimeter accuracy. Requirements on optics are enhanced, with hemispherical lenses and narrow band pass filters being used. A near-field return may result in the introduction of parallax error, i.e. movement of the returned laser spot over the sensor pixel array dependent on distance to object. To overcome these problems, the range device includes calibration functions to enable the subtraction of the electronic and optical delay through the host system. The illumination source wavelength should be visible so that the user can see what is being targeted and is typically around 635 nm.

The third application group is that of 3D cameras. In this application, a pixel array is used to avoid mechanical scanning of the array. Systems can be based on a number of different architectures. Both TOF and modulated illuminator based architectures are used, however, the latter is more robust to ambient light and thus fits best with established photodiode construction. Additional features, such as face and gesture recognition, are applications of this type of ranging device.

Most optical ranging implementations use either stereoscopic, structured light, direct TOF or phase extraction methods to ascertain the range to a target. Stereoscopic approaches use two typical cameras, and can have a heavy computation overhead to extract range. The structured light scheme uses diffractive optics, and the range is computed using a typical camera based on how a known projected shape or matrix of spots is deformed as it strikes the target. The direct TOF method uses a narrow pulsed laser with a time-digital converter (TDC) measuring the difference in time between transmission and first photon reception. Commonly, a "reverse mode" is employed, where the TDC measures the back-portion of time, i.e. the time from first photon reception to next pulse transmission. This scheme may minimize system activity to only the occasions where a photon is detected, and is therefore well matched to tightly controlled, low photon flux levels and medical applications, such as fluorescent lifetime microscopy (FLIM).

The phase extraction method is well suited to systems which implement computation of the generalized range equation using existing photodiode technology. It is also robust to background ambient light conditions, and may be adapted to allow for varying illuminator modulation wave-shapes (i.e. sinusoidal or square). This scheme is favored for SPADs in proximity detection applications.

The present disclosure takes advantage of the fact that the phase extraction method system incorporates an inherent ambient light level detection function which can be used in conjunction with a SPAD for many applications, including navigation devices for computers and the like.

It is important to understand the range equation derivation as it indicates the ease of applicability of SPADs to phase extraction proximity detection and ranging approaches. It also aids in the understanding of inherent features, such as ambient light metering and measuring a depth of interest for a specific purpose.

Distance is determined from the speed of light and TOF, as follows:

$$s = ct.$$

Where s is distance, c the speed of light, and t is time. For a ranging system however, the distance is doubled due to the fact there are send and receive paths. As such the distance measured in a ranging system s is given by:

$$s = \tfrac{1}{2}ct.$$

The time shift component (="t"), due to the photon TOF, is dependent on the modulation frequency and phase shift magnitude of the waveform (t=% shift of the returned waveform x $t_{mod\_period}$ and if $t_{mod\_period}=1/f_{mod}$)

$$\Rightarrow t = \frac{\phi}{2\pi} \cdot \frac{1}{f}$$

$$\Rightarrow t = \frac{\phi}{2\pi \cdot f}.$$

The units are in radians. Then, by substituting the above equation back into the starting equation, the "range equation" is expressed as:

$$\Rightarrow s = \frac{c \cdot \phi}{4\pi \cdot f}.$$

The critical component in this equation is φ, which is the unknown component of the % shift of the returned waveform. The following section discusses how this can be determined.

Figure 2A:
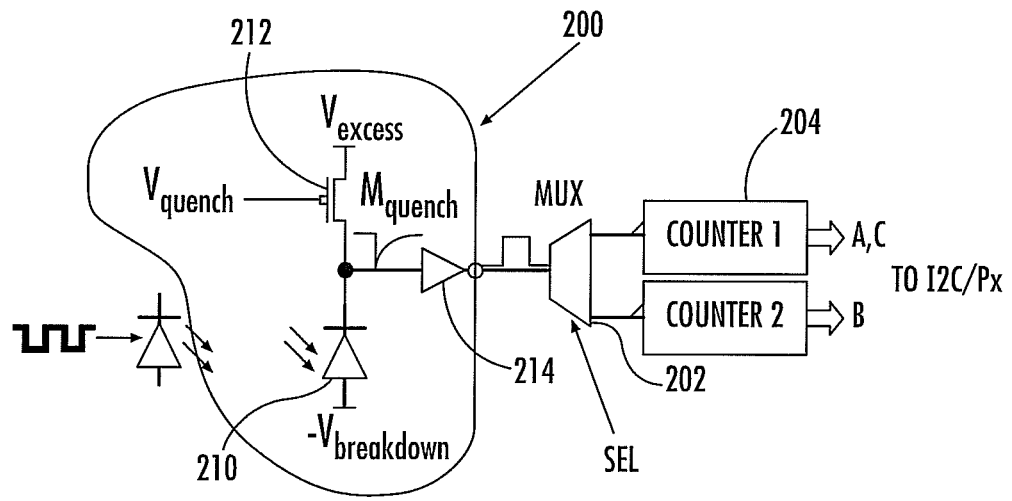
FIGS. 2A-2B are a diagram of a SPAD and an associated timing diagram, in accordance with an embodiment of the present disclosure.
Figure 2B:
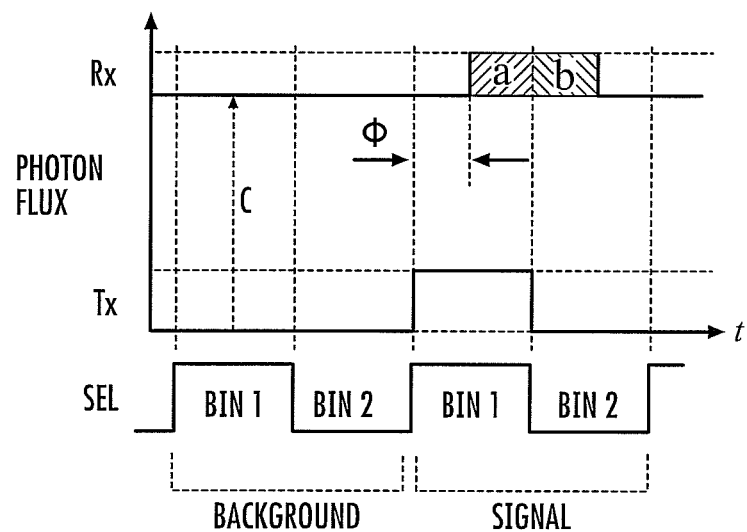

Since the values of c, f and n are all constants; the range result simply scales with φ, (the % shift of the received light waveform in relation to that which was transmitted). FIGS. 2A-2B demonstrate how φ may be determined for a system employing a square wave modulated illuminator. The transmitted and received waveforms are shifted from one another by φ. By measuring the photons that arrive in "a" and "b" in bins 1 and 2 respectively, the value of φ can be determined as follows:

$$\frac{\phi}{2\pi} = \frac{b_{count}}{(a+b)_{count}}.$$

In this type of system, there is a range limit set by the illuminator modulation frequency, which is known as the unambiguous range. Photons received from targets that are further away than this range can introduce an aliasing error by erroneously appearing in a legitimate bin for a subsequent measurement. Since determination of range is enabled by the modulation process, it is desirable to maximize the number of edges of the modulation waveform to accumulate data for averaging purposes as fast as possible. However, a high modulation frequency may lower the unambiguous range and introduces more technical complexity in the illumination source drive circuitry. Therefore, two or more different modulation frequencies may be interleaved or used intermittently, so as to reduce or negate the impact of aliased photons via appropriate data processing.

FIG. 2A illustrates a possible implementation of a SPAD based proximity sensor with an associated waveform diagram. FIG. 2A shows a SPAD 200 connected to a multiplexer 202. The output from the multiplexer passes through counters 1 and 2 (204). The SPAD device shown generally at 200 is of a standard type, including a photo diode 210, a p-type MOSFET 212 and a NOT gate 214.

The timing waveforms are shown in such a way so as to represent the relative photon arrival magnitudes. It can be seen that an extra phase has been added to enable computation of the background ambient light level offset "c," although this can be significantly reduced by the use of a narrow optical band-pass filter matched to the illumination wavelength if necessary. The element "c" is then accommodated in the computation of received light phase shift φ. The computed results for a, b, c are determined and written into either a temporary memory store or an I2C register. The computation of the phase shift φ, is calculated as follows:

$$\phi = \frac{a_{count} - c}{(a+b)_{count} - 2c}.$$

The predetermined selection of modulation frequency is performed by dedicated logic or host system that selects a suitable frequency or frequencies for the application of the range sensor. The range sensor of FIG. 2A is dependent on the amount of light that can be transmitted onto the scene, system power consumption, and the target reflectivity.

Since the system shown in FIG. 2A may need to compute the background light condition to ascertain the offset of the returned light pulse from the target, ambient light metering is included. A simplified timing scheme is employed if only the ambient light level data may be required, since the target illumination cycle is not necessary. If a narrow band IR filter is employed in the optical path, the value of c may represent only the content of the filter passband. This can then be extrapolated to an approximation of the general ambient light conditions.

Figure 3:
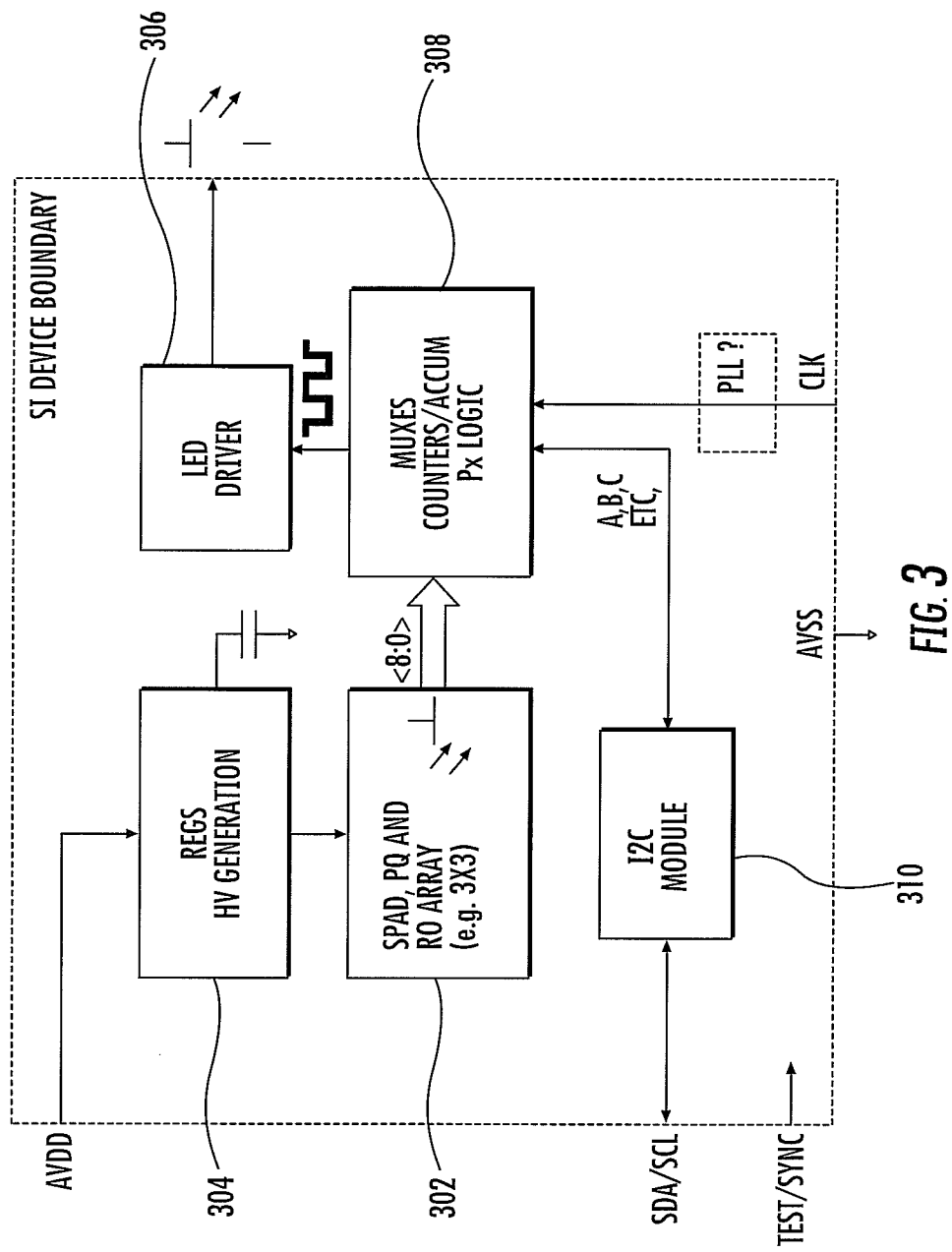
FIG. 3 is a block diagram of a proximity detector, in accordance with an embodiment of the present disclosure.

Referring to FIG. 3, a block diagram of a proximity sensor is shown. The proximity sensor 300 includes SPAD function and the quenching thereof in block 302. The quenching can be passive as shown or of any other suitable type. The bias voltage for the SPAD may be provided by a charge pump or any other suitable device 304. The sensor module also includes an LED or other illumination source and an associated driver 306 to ensure that the required modulation is applied to the illumination source.

The sensor may include a distance computation logic module to determine range. Alternatively, this can be located in a host device in which the range sensor is used. The sensor also includes multiplexers and counters 308 and a storage means 310, such as a I2C module or a store. The sensor may also include a Phase Locked Loop (PLL) for clocking and subsequent timed signal generation purposes.

The power consumption of SPADs and their readout circuits are dependent on the incident photon arrival rate. The average power consumption of a ranging system could be reduced by using power saving modes, such as pulsed on/off operation, at a rate of ~10 Hz for example, at the expense of target motion distortion.

The sensor may be implemented on a 1 mm² die size and the I2C module could also be implemented on an appropriate die. The sensor may include an optical package, an integral IR band pass filter (either coating or inherent in the optical elements) and an optimal field of view of about 30°. As the sensor is not intended to "create an image" but is instead used to ensure that as many photons as possible are detected the optics could be made from injection molded hemispherical elements.

The illuminator source should ideally be of a non-visible wavelength, for example, in the Near Infrared (NIR) band, such as 850 nm. It should be noted that the terms "optical," "illumination," and "light" are intended to cover other wavelength ranges in the spectrum and are not limited to the visual spectrum.

The proximity sensor has been described with reference to simple low cost system, although it may be appreciated for certain applications the laser ranging and 3D camera technologies discussed above, could be used. As previously indicated, the proximity sensor of the present disclosure is versatile and can be used in a vast array of different applications. One such application based on a proximity detector is now described.

Figure 4:
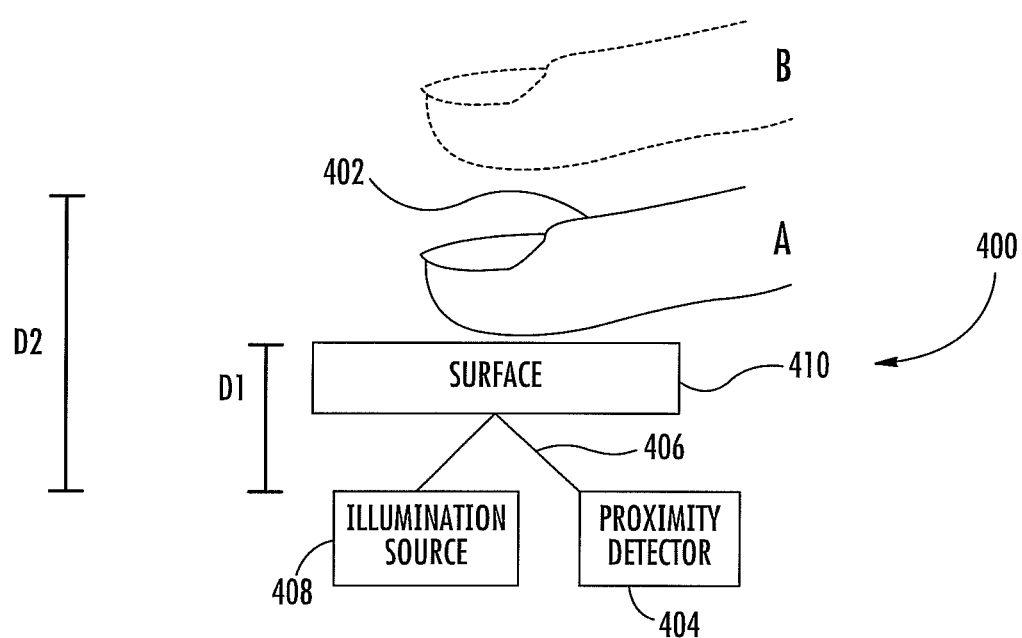
FIG. 4 is a block diagram of a navigation device including a proximity detector, in accordance with an embodiment of the present disclosure.

Referring to FIG. 4, a schematic view of a navigation device 400 is shown (the device 400 is not drawn to scale relative to the finger 402). The navigation device includes a SPAD proximity detector 404, which is illuminated in use by a reflected beam 406 from an illumination source 408. The illumination source is capable of illuminating a target object, illustratively shown as a finger 402, which is above or in proximity with a window in the surface 410 of the device so that at least some of the illumination is reflected back to the proximity detector 404. The window is generally an optical transmitter, usually comprising glass or plastic, which may be colored or clear as long as it transmits light.

The proximity detector according to the present disclosure is capable of detecting movement in three axes. As is the case with a fingermouse, the movement of a finger above the surface 410 can detect movement in the X and Y axes, thereby causing a cursor to move around the screen based on the movement of the finger. The movement is measured by determining the sequence of detected reflection data on the individual SPAD devices in the SPAD array to determine the required movement of the cursor. In addition, the navigation device of the present disclosure can detect movement in the Z axis. In FIG. 4, there are two finger positions shown at A and B. At position A, the finger is at a distance d1 from the SPAD, and in position B, the finger is at a distance d2 from the SPAD. As the SPAD can measure these distances, a further element of control can now be implemented by moving the finger up and down relative to the surface 410. This movement can be used for other navigation functions or for other purposes, such as volume control when using media playing software, brightness control when adjusting peripheral settings, or controlling zoom functionality in software applications like internet browsing or text editing/reading.

In a co-pending Great Britain Patent Application No. GB 2486164 A, the content of which is hereby incorporated by reference in its entirety, a mobile phone includes a proximity detector for determining the distance of a user from the phone to enable volume setting, etc. The navigation device of the present disclosure could be used in one mode to carry out this function.

The illumination source is located in any appropriate location that may enable the target object 402 to be illuminated and reflect a beam to the proximity detector. The illumination sources may include modulated light emitting diodes (LEDs), modulated lasers or any other appropriate illumination source. Similarly, the proximity detector can be located on any suitable surface or location as long as it functions as described above.

The present disclosure is directed to navigation devices that can be used in any appropriate device, including for example, computers, phones, cameras, PDAs security systems etc. The navigation device of the present disclosure can be combined with other features, such as fingerprint detection as disclosed in co-pending application GB 2484077 A, the content of which is hereby incorporated by reference in its entirety, and other functions that may be evident to the person skilled in the art.

The navigation device as described above is operated by movement of a finger; however, it may be appreciated that other types of pointers or activators are equally relevant. In addition, the relative orientations of the elements of the navigation device can vary as long as the functions and effects of illumination, reflection, and detection are observed. The finger is described as being above the window, although it is possible that the finger may come in contact therewith on occasions. Accordingly, the finger being above the window is intended to mean in contact with or in close proximity with the window. It may be appreciated that many variations of the present disclosure could apply and are intended to be encompassed within the scope of the claims.

That which is claimed is:
1. A navigation device comprising:
a housing having a transparent window on an external surface thereof, said transparent window defining a mousing surface;
a proximity detector carried internally by said housing and comprising an array of single photon avalanche diodes (SPADs) configured to detect three-dimensional movement of an adjacent activator relative to said mousing surface;
an illumination source carried internally by said housing and configured to transmit illumination through said transparent window and to be reflected by the activator through said transparent window and to said array of SPADs; and
a controller configured to calculate a phase change between transmitted illumination and illumination received following reflection from the activator, and to determine a range of the activator to said housing based upon operating said illumination source with a plurality of different modulation frequencies.

2. The navigation device of claim 1 wherein said array of SPADs is arranged in rows and columns.

3. The navigation device of claim 1 further comprising a multiplexer and associated counter coupled to said array of SPADs and configured to measure the reflected illumination.

4. The navigation device of claim 1 wherein said proximity detector is configured to control device cursor movement.

5. The navigation device of claim 1 wherein said proximity detector is configured to detect movement of the activator in the first and second dimensions by determining a sequence of detected illumination on respective SPADs in said array of SPADs, and in the third dimension based upon a calculation of the phase change to detect proximity of the activator.

6. The navigation device of claim 1 wherein said proximity detector is configured to use the activator movement in at least one axis for a function other than navigation.

7. The navigation device of claim 1 wherein said proximity detector is configured to detect the activator comprising a finger.

8. An electronic device comprising:
a housing having a transparent window on an external surface thereof, said transparent window defining a mousing surface;
a navigation device carried internally by said housing and comprising a proximity detector comprising at least one single photon avalanche diode (SPAD) configured to detect three-dimensional movement of an activator relative to said mousing surface;
an illumination source carried internally by said housing and configured to transmit illumination through said transparent window and to be reflected by the activator through said transparent window and to said at least one SPAD; and
a controller configured to compare transmitted illumination and illumination received following reflection from the activator, and to determine a range of the activator to said housing based upon operating said illumination source with a plurality of different modulation frequencies.

9. The electronic device of claim 8 wherein said at least one SPAD comprises an array of SPADs.

10. The electronic device of claim 9 wherein said controller is configured to compare by at least calculating a phase change between the transmitted illumination and the illumination received following reflection from the activator.

11. The electronic device of claim 9 wherein said array of SPADs is arranged in rows and columns.

12. The electronic device of claim 9 further comprising a multiplexer and associated counter coupled to said array of SPADs and configured to measure the reflected illumination.

13. The electronic device of claim 8 wherein said proximity detector is configured to control device cursor movement.

14. The electronic device of claim 9 wherein said proximity detector is configured to measure activator movement in three axes.

15. The electronic device of claim 14 wherein said proximity detector is configured to detect movement of the activator in the first and second dimensions by determining a sequence of detected illumination on respective SPADs in said array of SPADs, and in the third dimension based upon a calculation of the phase change to detect proximity of the activator.

16. The electronic device of claim 14 wherein said proximity detector is configured to use the activator movement in at least one axis for a function other than navigation.

17. The electronic device of claim 8 wherein said proximity detector is configured to detect the activator comprising a finger.

18. The electronic device of claim 8 further comprising a phone device carried by said housing.

19. The electronic device of claim 8 further comprising a computer mouse device carried by said housing.

20. The electronic device of claim 8 further comprising a computing device carried by said housing.

21. A method of making a navigation device comprising:
forming a housing having a transparent window on an external surface thereof, the transparent window defining a mousing surface;
forming a proximity detector to be carried internally by the housing and comprising at least one single photon avalanche diode (SPAD) to detect three-dimensional movement of an adjacent activator relative to the mousing surface;
coupling an illumination source to be carried internally by the housing and to transmit illumination through the transparent window and to be reflected by the activator through the transparent window and to the at least one SPAD; and
coupling a controller to compare transmitted illumination and the illumination received following reflection from the activator, and to determine a range of the activator to the housing based upon operating the illumination source with a plurality of different modulation frequencies.

22. The method of claim 21 further comprising forming the at least one SPAD to comprise an array of SPADs.

23. The method of claim 22 further comprising using the controller to compare by at least calculating a phase change between the transmitted illumination and the illumination received following reflection from the activator.

24. The method of claim 23 further comprising forming the array of SPADs in rows and columns.

25. The method of claim 23 further comprising coupling a multiplexer and associated counter to the array of SPADs to measure the reflected illumination.

26. The navigation device of claim 1 wherein said proximity detector is configured to detect a depth of the adjacent activator relative to said mousing surface as part of the three-dimensional movement.

27. A method for operating an electronic device comprising a housing having a transparent window on an external surface thereof, the transparent window defining a mousing surface, a navigation device carried internally by the housing and comprising a proximity detector comprising at least one single photon avalanche diode (SPAD), and an illumination source carried internally by the housing, the method comprising:

operating the proximity detector to detect three-dimensional movement of an activator relative to the mousing surface;

operating the illumination source to transmit illumination through the transparent window and to be reflected by the activator through the transparent window and to the at least one SPAD; and comparing transmitted illumination and illumination received following reflection from the activator, and determining a range of the activator to the housing based upon operating the illumination source with a plurality of different modulation frequencies.

28. The method of claim 27 wherein the comparing comprises calculating a phase change between the transmitted illumination and the illumination received following reflection from the activator.

29. The method of claim 27 further comprising operating the proximity detector to control device cursor movement.

30. The navigation device of claim 1 wherein said controller is configured to operate said illumination source with a plurality of modulation wave-shapes.

* * * * *